United States Patent [19]

Kongable

[11] 3,751,292

[45] Aug. 7, 1973

[54] MULTILAYER METALLIZATION SYSTEM

[75] Inventor: Lowell S. Kongable, Scottsdale, Ariz.

[73] Assignee: Motorola, Inc., Franklin Park, Ill.

[22] Filed: Aug. 20, 1971

[21] Appl. No.: 173,542

[52] U.S. Cl. .................... 117/212, 29/589, 29/625, 117/217, 156/17, 317/234 M

[51] Int. Cl. .................... B44d 1/18

[58] Field of Search .................... 117/212, 217, 215; 317/234 M, 234 N; 29/589, 625; 156/17

[56] References Cited

UNITED STATES PATENTS

| | | | |
|---|---|---|---|
| 3,668,484 | 6/1972 | Greig et al. | 317/234 M X |
| 3,585,461 | 6/1971 | Eynon et al. | 317/234 M |
| 3,476,984 | 11/1969 | Tibol | 317/234 N |
| 3,672,983 | 6/1972 | DeWitt et al. | 117/212 |
| 3,657,029 | 4/1972 | Fuller | 117/212 X |
| 3,449,825 | 6/1969 | Loro | 317/234 M |

OTHER PUBLICATIONS

Mutter et al. Ag Metallurgy For Integrated Circuit Devices IBM Tech. Discl., Vol. 13 No. 2, July 1970, pp 511–512.

*Primary Examiner*—Edward G. Whitby
*Attorney*—Mueller & Aichele

[57] ABSTRACT

There is disclosed a multilayer metallization system for use with medium scale and large scale integrated circuits in which titanium-platinum-gold beam leads are used in all of the metallization systems over the integrated circuit. A method is described in which successive metallization system are stacked one on top of another with passivation in between, in which the gold top portion of an underlying beam lead is contacted by a gold portion of the beam lead immediately thereabove. The method includes as an important step, removing the platinum and titanium of an overlying beam lead from an underlying passivation layer in the vicinity of a via hole in the passivation layer prior to the formation of this hole. This is followed by the formation of the via hole and the deposition of gold both over the platinum layer and into the via hole so as to contact the gold top portion of an underlying beam lead thereby forming a gold-gold interface. The method described permits the formation of multilayered Au-Pt-Ti beam lead structures which preserve the beam lead hermetic seal, which preserve the ohmic contact qualities of the beam lead structure, and which permit the stacking of the Au-Pt-Ti beam leads without the necessity of exotic processing or interfacing materials necessary to prevent peeling and poor ohmic contact.

9 Claims, 10 Drawing Figures

PRIOR ART

INVENTOR
*Lowell S. Kongable*

BY

*Mueller & Aichele*
ATTY'S.

INVENTOR
Lowell S. Kongable
BY
Mueller & Aichele
ATTY'S.

INVENTOR
Lowell S. Kongable
BY
Mueller & Aichele
ATTY'S.

INVENTOR
Lowell S. Kongable
BY
Mueller & Aichele
ATTY'S.

MULTILAYER METALLIZATION SYSTEM

BACKGROUND OF THE INVENTION

This invention relates to a multilayer metallization systems and more particularly to multilayer metallization systems utilizing titanium-platinum-gold superimposed beam leads.

Single-layer beam lead metallization systems utilizing titanium-platinum-gold have been known for some time to provide excellent contacts having a good hermetic seal in a single plane over a semiconductor wafer or chip. The single-layer beam lead metallization is well described in the U. S. Patent to M. P. Lepselter, U.S. Pat. No. 3,287,612 issued on Nov. 22, 1966. It is possible with the single-layer metallization to provide interconnect leads from active elements on a semiconductor chip to the periphery of the chip at which point external connections can be made. However as the integrated circuits carried on a chip become more complex, the number of interconnections which must be made between the active elements in the chip increases such that single-layer metallization is insufficient for making these numerous interconnects in a single metallization plane. In an effort to solve this problem, multilayer metallization has been provided in which the metallization layers are separated by passivation layers. This permits an increase in the number of interconnections that can be made since the area necessary to make the interconnection is but a fraction of the total metallization in each layer. However there are very special problems with the use of the Au-Pt-Ti metallization system due to the lack of adherence of the gold to commonly used passivation layers, and due to any gold-titanium interface. The problem with gold-titanium interfaces concern the oxides which are built up at the interface during high humidity conditions. Oxide growth at the interface reduces the adherence of the gold on the titanium such that unreliable contacts result after a period of time. While it is true that in pure aluminum metallization systems multilayered contacting structures have been successfully fabricated, these do not have the hermeticity of the Ti-Pt-Au beam lead metallization systems.

To illustrate some of the difficulties in multilayering the Ti-Pt-Au beam loads, if one were to cover a first such metallization system with a passivation layer of either silicon oxide or silicon nitride or a combination of the two, and if one were to open up a hole (herein referred to as a via hole) in the passivation layer, and if one were to deposit a second metallization system consisting of titanium-platinum-gold, it will be appreciated that the resulting titanium-gold interface would not only have the aforementioned oxidation problem but would also result in a high resistance between the titanium and the gold at the titanium-gold interface.

The solution to this problem involves making the via hole after the deposition of the titanium and platinum layers of the overlying beam lead. This is unlike conventional processing in which the via hole is made first. A second step in solving the problem involves removing that portion of the platinum and titanium on the underlying passivation layer which is in the immediate vicinity of the place where the via hole is to be made. This leaves small end portions of titanium and platinum exposed. Once the platinum and titanium have been removed from this area, the via hole is made and gold is evaporated both over the top platinum layer, over the exposed portion of the passivation layer and down into the via hole where the gold contacts the gold of the first metallization system.

In this manner there is a gold-gold contact which serves also to anchor the gold so that it cannot peel away from the end portion of the titanium layer. It will be appreciated that the exposed end portion of the titanium layer are relatively small and that mechanical stability is achieved by anchoring the major portion of the evaporated gold to the gold top layer of the first metallization. It will be further appreciated that by removing the platinum and titanium from the immediate vicinity of the via hole, a two-step type structure is presented to the evaporated gold. The first step is at the edge of the platinum while the second step is the edge of the via hole. In this manner two small steps are presented to the gold evaporation instead of one large step which would be the case if the hole in the platinum and titanium layers were made at the same time as the via hole.

It will be noted at this point in the method that a gold evaporation step is used. This is unlike the straight plating in the prior art. In the subject method after the evaporation of the gold, a conventional gold plating process is performed. The purpose of the evaporation step is the making of an electroplating current conducting path which extends into the via hole to make contact to the gold in the first metallization layer. In the single layer system the titanium is left covering the entire wafer, until the gold plating operation is finished. This titanium layer is used as the electroplating current conduction path. The titanium cannot be used as the plating current carrier for the second layer because it would be in contact with the first layer of gold and cause reliability problems. Further, the gold in the subject method is evaporated over the entire top surface of the wafer to a thickness of about 5,000 A. Thereafter a photoresist mask is placed over the evaporated gold, such that the gold deposited in the plating process is not deposited on those areas of the substrate which will be intermediate the metallization strips. After the requisite amount of gold has been plated, the photoresist layer is removed and the entire top surface of the wafer is etched. What is etched is primarily the 5,000 A of evaporated gold which is to be removed so that the areas in between the metallization strips can be cleaned down to the passivation layer which covers the first metallization system. Thus by a simple etching step the 5,000 A of evaporated gold which serves to make the ohmic contact between the top and bottom layers of plated gold is easily removable from areas where it is not wanted.

What has been accomplished is the provision of a Ti-Pt-Au multilayered metallization system which is easily fabricated involving a minimum of processing steps and which solves the metallurgical problems as well as the electrical problems involved in using what heretofor has been a very successful single-layer beam lead metallization system.

SUMMARY OF THE INVENTION

It is therefore an object of this invention to provide an improved multilayer metallization system.

It is a further object of this invention to provide an improved multilayer metallization system in which all of the layers utilize the Ti-Pt-Au beam lead metallization.

It is a still further object of this invention to provide a method for forming a multilayered metallization structure in which platinum and titanium layers are removed from the immediate vicinity of those portions of the passivation layer at which via holes are to be made such that subsequent gold metallization layers extend directly to the top portion of a gold sub-layer therebeneath.

It is a further object of this invention to provide a Ti-Pt-Au metallization system for overlying and contacting an underlying Ti-Pt-Au metallization system in which the gold of the superimposed metallization system extends to the gold in the underlying metallization system through a via hole in a passivation layer therebetween such that evaporated gold used in making the superimposed metallization system sees a shallow-stepped structure.

It is yet another object of this invention to increase the mechanical stability of a Ti-Pt-Au multilayered metallization structure by cutting back a Ti-Pt layer on a passivation layer between metallization layers from the vicinity of a via hole through the passivation layer, by forming the via hole in the passivation layer and by first evaporating gold followed by plating gold over the evaporated gold.

Other objects and features of this invention will become more fully apparent upon reading the following description taken in connection with the accompanying drawings.

BRIEF DESCRIPTION OF THE INVENTION

There is disclosed a multilayer metallization system for use with medium scale and large scale integrated circuits in which titanium-platinum-gold beam leads are used in all of the metallization layers over the integrated circuit. A method is described in which successive metallization systems are stacked one on top of another with passivation in between, in which the gold top portion of an underlying beam lead is contacted by a gold portion of the beam lead immediately thereabove. The method includes as an important step, removing the platinum and titanium of an overlying beam lead from an underlying passivation layer in the vicinity of a via hole in the passivation layer prior to the formation of this hole. This is followed by the formation of the via hole and the deposition of gold both over the platinum layer and into the via hole so as to contact the gold top portion of an underlying beam lead thereby forming a gold-gold interface. The method described permits the formation of multilayered AU-Pt-Ti beam lead structures which preserve the beam lead hermetic seal, which preserve the ohmic contact qualities of the beam lead structure, and which permit the stacking of the Au-Pt-Ti beam leads without the necessity of exotic processing or interfacing materials for preventing peeling and poor ohmic contact.

DETAILED DESCRIPTION OF THE INVENTION

Figure 1:
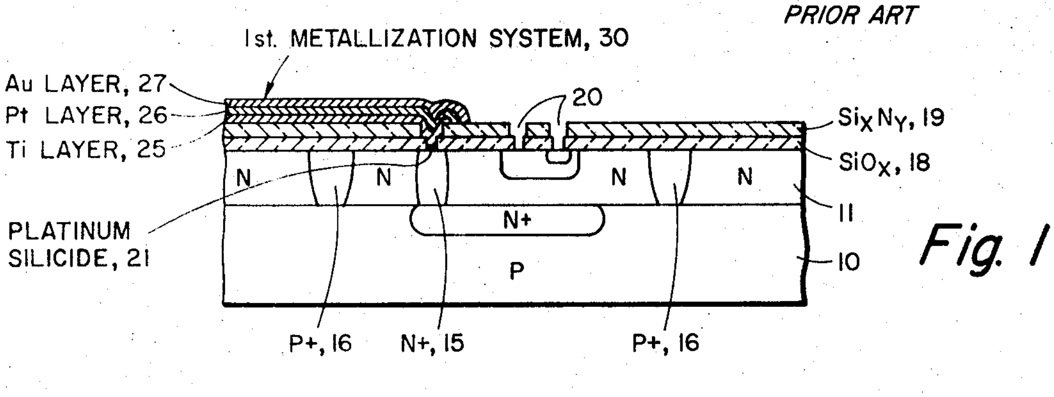

As mentioned hereinbefore, because gold does not readily adhere to normal passivation materials an exotic titanium-platinum-gold layered structure is used in the contacting of various active elements in the semiconductor chip. Although it is the gold that is the major current carrying member, titanium is used so that the multilayered structure will adhere to the passivation layer with platinum being used as an intermediary to prevent a titanium-gold interface at which deleterious oxides occur. The use of the single level metallization is shown in FIG. 1. Here a substrate 10 is provided with an epitaxially grown region of opposite conductivity 11 into which are diffused various active regions of a semiconductor device. In this drawing a buried layer collector contact is labeled by the reference character 15. On either side of the active device are deep diffused regions 16 which serve as an isolation ring for the active device there encircled. On top of the epitaxially grown portion 11 of the substrate 10 is a silicon oxide passivation layer 18 covered by a silicon nitride passivation layer 19. Alphabetic symbols are utilized as subscripts in FIG. 1 to indicate the atomic numbers of the constituent elements because these atomic numbers have been shown to vary for the oxides and nitrides of silicon.

Above each of the active elements in the epitaxial region 11 are formed "via" holes 20 through which the beam lead metallization extends so as to contact the active device therebeneath. The etching of the via holes is conventional, with the hole in the nitride layer serving as an etch mask for the formation of the hole in the oxide layer. In the via holes thus produced is first deposited a layer of platinum which when heated forms a platinum-silicide layer 21 as shown over the $N^+$ diffused contact region 15. Thereafter a titanium layer 25 is deposited followed by the deposition of a platinum layer 26 and the plating of a gold layer 27 to complete the first metallization system 30. Here it will be appreciated that contact to the $N^+$ diffused region 15 is made through the platinum silicide, through the titanium, through platinum and finally to the outer or top gold layer 27. As mentioned before this type of metallization is conventional and is referred to as beam lead metallization.

Figure 2:
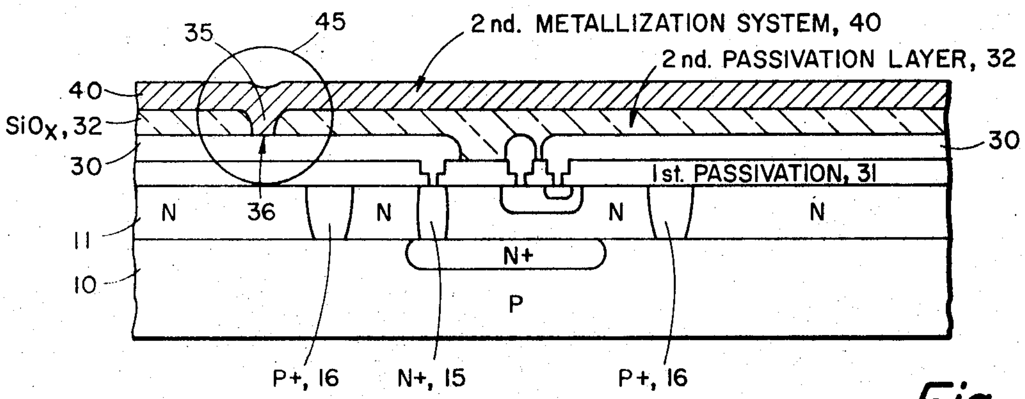

As mentioned before it is no simple matter to provide a second level of metallization such as that shown in FIG. 2. In this figure the passivation layers 18 and 19 are grouped together and are referred to as passivation layer 31. The first metallization system is labeled as in FIG. 1 to be metallization system 30. On top of the first metallization system is deposited another conventional passivation layer 32 which, while it does not adhere to the first metal-lization system because the top portion thereof is gold, it does adhere to those exposed portions of the passivation layer 31 which lie between the metallization strips. It will be appreciated that since only part of the passivation layer 31 is covered by the first metallization system 30, excellent adherence of the passivation 32 to the passivation layer 31 is accomplished.

If one were to refer to multilayer metallization systems in which aluminum is used, one would find that an aperture or via hole such as that shown at 35 would be etched through the passivation layer 32 and a second metallization layer consisting of aluminum deposited on the passivation layer as shown by the second metallization system 40. Unfortunately, however, neither a pure aluminum second metallization system nor a layer identical to the first metallization system can be deposited directly over the second passivation layer 32. This is because the reliability available with aluminum metallizations over a passivation layer is not as good as the aforementioned beam lead metallization. As pointed out hereinbefore, the mere repetition of the use of the titanium-platinum-gold metallization system will not produce a good ohmic contact because of the titanium-gold interface 36 which would occur as shown in FIG. 2.

Figure 3:
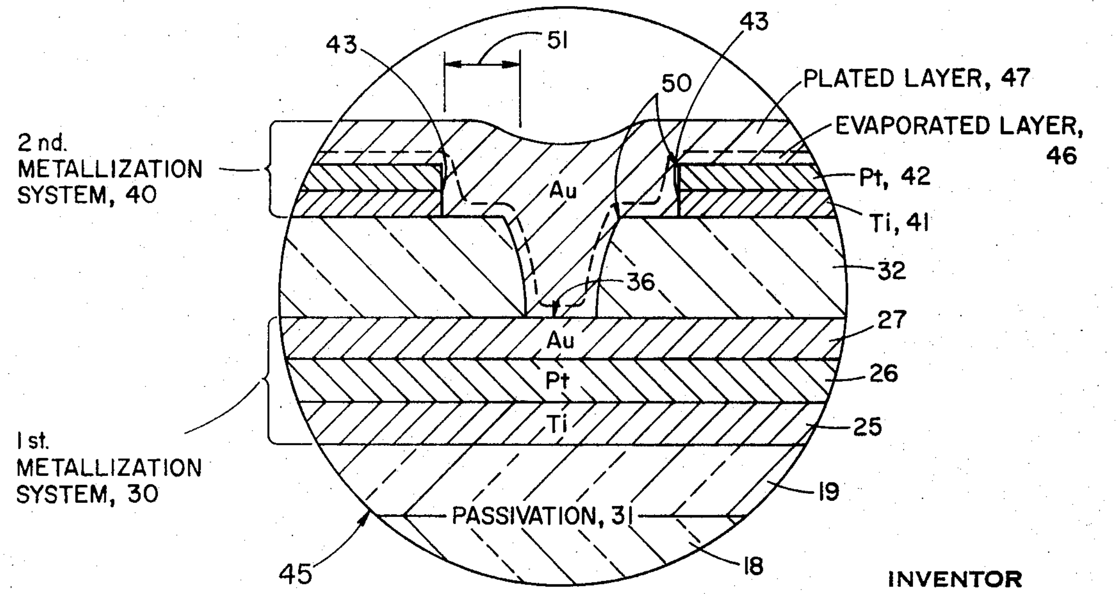

If however the second metallization system takes on the configuration shown in FIG. 3 to be that portion of the structure shown in FIG. 2 encircled by the circle 45, then not only can the beam lead type metallization be used for a second system, but also a gold-gold interface between the first and second systems results. In this figure a portion of the passivation layers 18 and 19 is shown covered by a portion of the first metallization system 30 comprising the titanium-platinum-gold composite shown by the layers 25, 26 and 27. A portion of the passivation layer 32, which is in general an oxide of silicon, is shown with a via hole 35 there-through. In this diagram it can be seen that the second metallization system 40 is comprised of a titanium layer 41 followed by a platinum layer 42. These layers have been cut away from the vicinity of the via hole 35 as shown by the edges 43. On top of the platinum layer is an evaporated layer of gold shown by the dotted line 46 over which is plated the final layer of gold 47 thereby comprising the second metallization system.

The gold evaporation is a very important preliminary step. In the first place it provides a gold surface on which to plate more gold. Secondly it provides a current carrying layer for use as an electrode in the plating process. Thirdly the evaporated gold reaches down into via hole 35 to evenly coat the exposed surface of layer 27. All three of these functions prevent peeling and aid in the mechanical stability of the contact.

In addition to the gold-gold interface 36, it will be appreciated that the evaporated gold when deposited "sees" two shallow corners or steps shown by the arrows 50. It will be appreciated that if the platinum and titanium layers 41 and 42 were not etched away from the vicinity of the via hole and the via hole were made by etching through the platinum and titanium layers and into the passivation layer, there would exist a large distance for the gold atoms to travel to get down to the bottom of the hole. However because of the shallow step structure shown by etching away of the platinum and titanium layers 41 and 42, the gold is better able to cover the sharp corners of the steps. In so doing while the gold does not adhere to the sidewalls of the hole 35, it is anchored both at the top and end portions of the platinum layer 42 and at the interface 36. Secondly, only a small end portion of the titanium layer 41 touches the evaporated gold layer 46. Although an oxide is formed thereat it is insignificant when compared to the platinum-gold interface between layers 42 and 46. This oxide does not significantly alter the mechanical stability of the gold contact layer both because the area of the oxide formation is very small and because the gold layer is anchored at the bottom of the hole 35 to the top portion of the gold layer 27.

For best results the distance that the platinum and gold layers 41 and 42 should be etched away from the area of the via hole should be greater than 0.15 mils as shown by the arrow 51. The layers of titanium 41 and platinum 42 have an average total thickness of 2,600 A and are etched by conventional photolithographic processing means. The layer 46 is approximately 5,000 A of evaporated gold followed by a plated layer 47 of gold averaging 3 microns in thickness.

A process by which the overlying beam lead metallization layer is fabricated is shown in connection with FIGS. 4 - 10.

Figure 4:
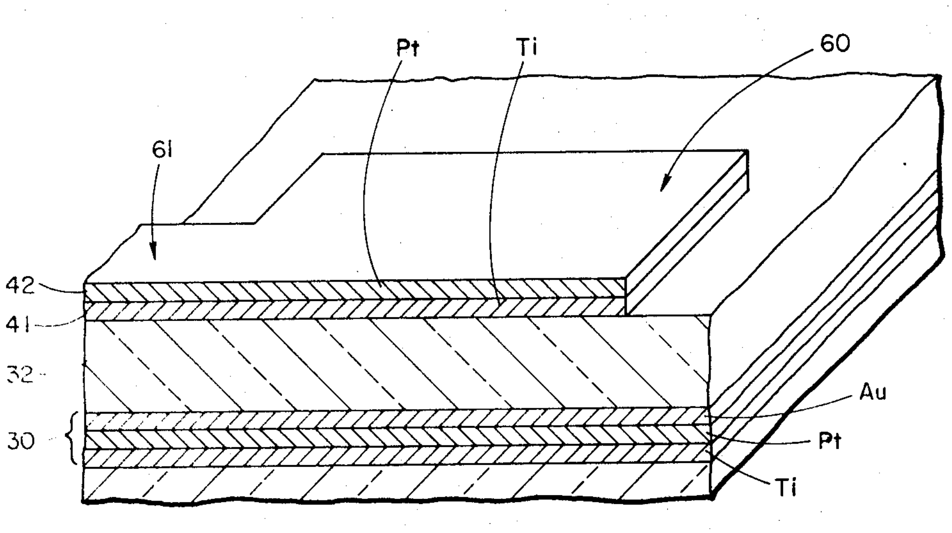
Figure 5:
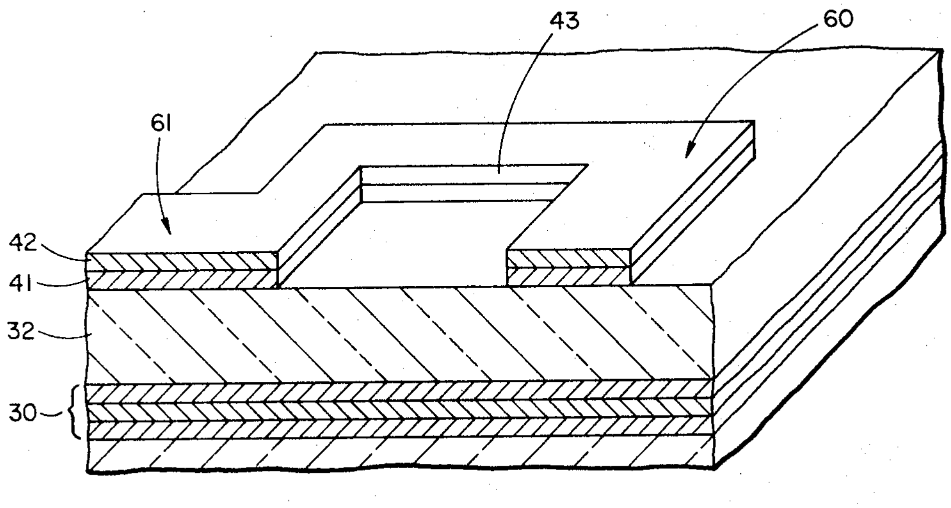
Figure 6:
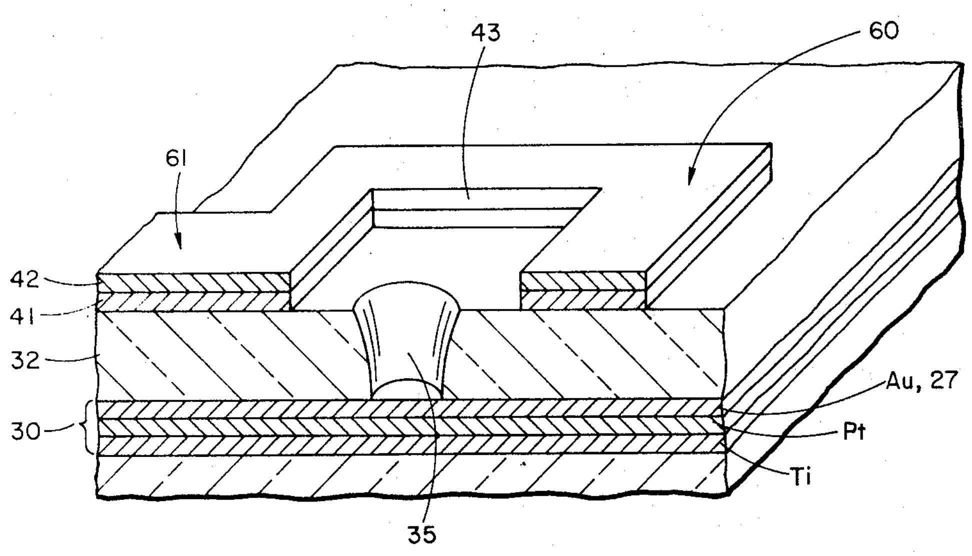
Figure 7:
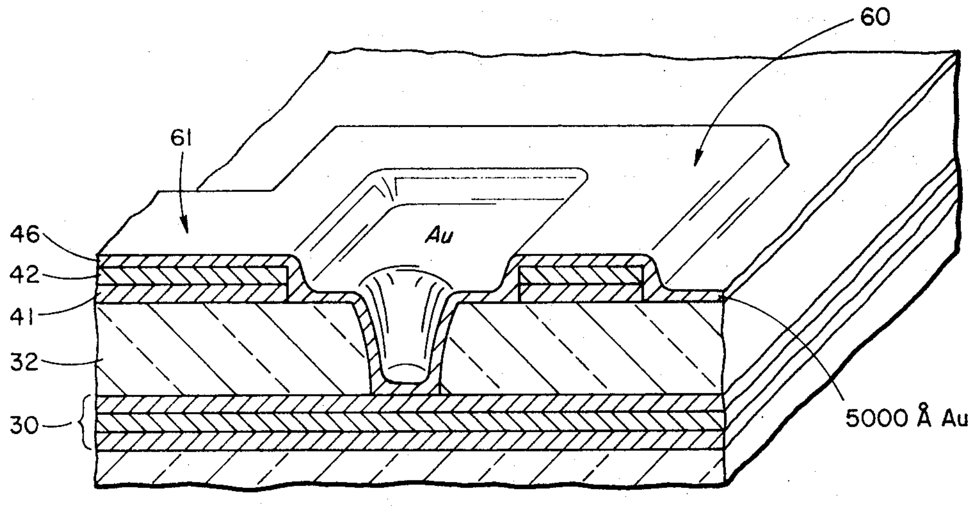
Figure 8:
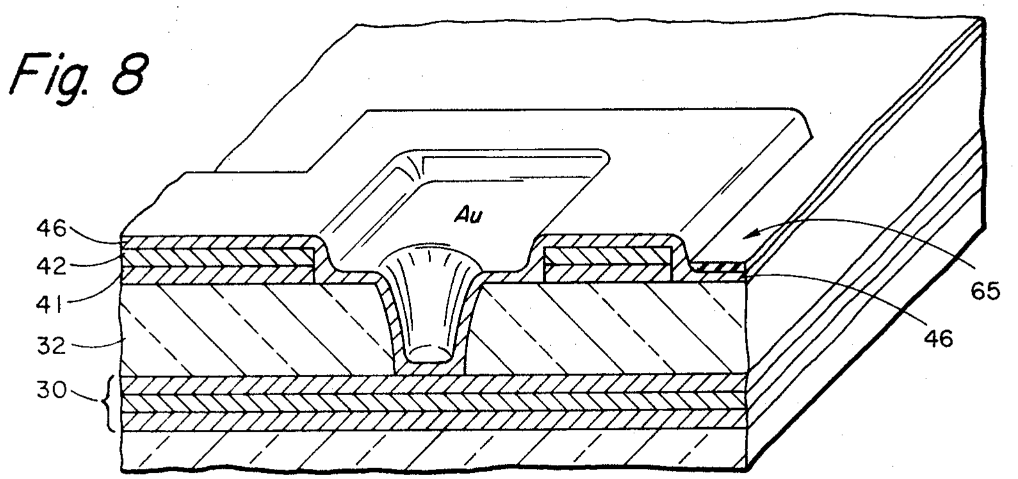
Figure 9:
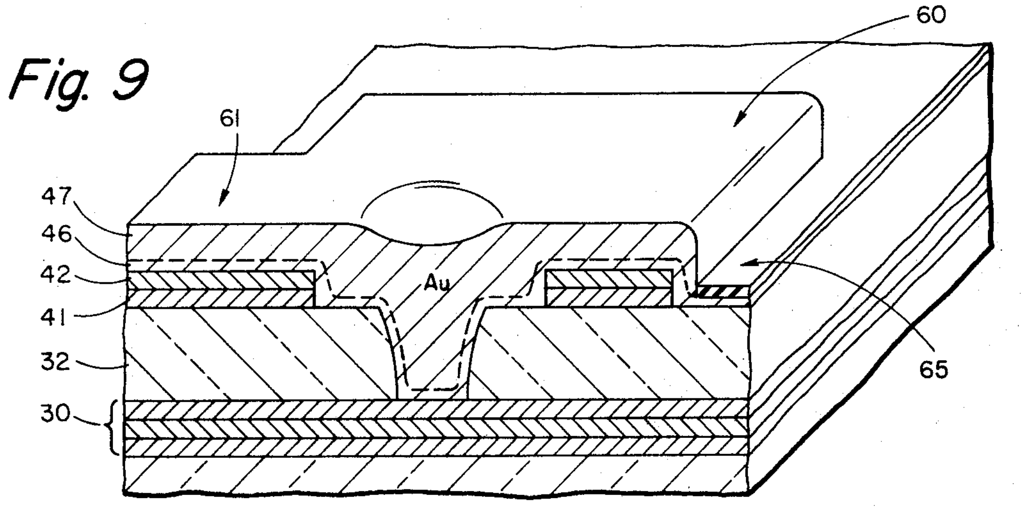
Figure 10:
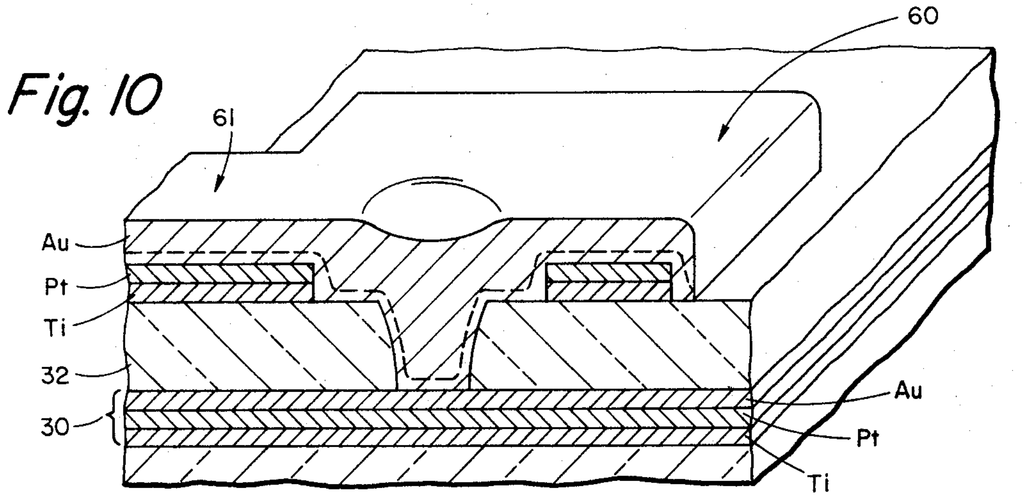

As shown in FIG. 4 a silicon oxide passivation layer 32 is provided over the first metallization layer 30 and is provided with a layer 41 of titanium followed by a layer 42 of platinum. These layers are deposited by first sputtering on the titanium layer followed by a sputtering of the platinum layer. The titanium is on the order of 1,100 A thick and the platinum is sputtered to a thickness of 1,500 A. Photoresist (not shown) is then coated onto the top surface of the structure and processed leaving the platinum exposed over those portions of the passivation layer 32 from which these layers are to be removed. Standard etchants such as aqua regia and sulfuric acid respectively are used to etch the platinum and titanium layers down to the passivation layer 32. This photoresist layer (not shown) is also patterned so as to expose a central region for the contact pad 60 shown in FIG. 4 so as to form the aperture 35 as shown in FIG. 5 when the platinum and titanium layers 42 and 41 are etched. The aperture size is such that the metal layers 41 and 42 do not extend closer than 0.15 mils to the area of the via hole which distance is measured as shown in FIG. 3. As shown in FIG. 6 the via hole 35 is etched through the passivation layer 32 down to the gold layer 27 of the first metallization system 30. This is accomplished by a standard photolithographic process. Thereafter as shown in FIG. 7 a 5,000 A thick gold layer 46 is evaporated as shown. This evaporated gold layer is used to carry the current for a follow-on electroplating step to be described in connection with FIG. 9. In the evaporation step the wafers are placed in a standard evaporation bell jar and the pressure inside the jar is reduced to 1 micron. Previous to producing the vacuum approximately 25 inches of 25-mil diameter gold wire are placed in the evaporating pot to produce 5,000 A of gold on the wafers. After evaporation the substrates are allowed to cool 15 minutes and then the vacuum seal is broken so the wafers can be removed. In FIG. 8 a photoresist layer 65 is deposited and patterned over that portion of the evaporated gold layer 46 which is to be later removed from the surface of the passivation layer 32. Referring to FIG. 9 approximately 3 microns of gold is placed onto the top surface of the evaporated gold layer 46 so as to complete the contact pad 60 as well as the lead portion 61 shown in this Figure. This plating process is conventional and is described as follows: The wafers are placed in a potassium-gold-cyanide salt solution with one electrode attached to the evaporated gold and the other electrode remaining in the solution. A 10 ma. DC voltage is applied until approximately 3 microns have been deposited. Thereafter as shown in FIG. 10 the photoresist 65 is removed and the entire top surface of the structure thus formed is etched until the 5,000 A of the gold layer 46 thus exposed is etched off the passivation layer 32 by standard gold etching techniques. One such technique utilizes an aqua regia etchant. The structure that remains is shown in FIG. 10 which is a structure similar to that shown in connection with FIG. 3 with the beam lead patterned so as to define a contact pad 60 and a lead portion 61 with the remainder of the top surface of the passivation layer 32 being free of all metal. Thus in addition to providing current carrying means for the electroplating process, the layer 46 is shown to be easily removed in a preferential etching step which leaves the majority of the top surface of the layer 47 still intact.

It will be appreciated that the above mentioned set of steps can be utilized to provide further metallization systems on top of the second metallization system shown, by again providing a further passivation layer and a further set of metallization systems as described.

What has been described therefore is a series of steps in which beam lead metallization can be again used in a second and further successive systems over top of a first beam lead metallization system in which excellent ohmic contact is obtained without peeling or loss of hermeticity between the first and successive metallization layers. This is accomplished primarily by forming the via hole after the titanium and platinum metallization layers have been etched in the vicinity of the place where the via hole is to be placed. Otherwise, the titanium and platinum must be cleaned from the via hole with the possibility of a poor cleaning operation causing a reliability problem later on. The gold-to-gold interface improves ohmic contact between the successive metallization systems, and also anchors the upper metallization system to the lower metallization system. In addition there is shown the use of an evaporated layer of gold followed by a plated layer of gold with the evaporated layer serving as a current carrying layer for the plating process. This results not only in increased mechanical stability, but also an increase in the quality in ohmic contact. As a further by-product the evaporated metallization layer can be removed from areas on top of the passivation layer which are to remain free of metallization. Finally there is provided as a by-product of this process, a shallow-stepped structure which permits the permeation of the gold atoms down through and on the sides of the via hole much more uniformly than is possible when a single-stepped structure is provided.

What is claimed is:

1. In a multilayer metallization system for providing external connections to semiconductor elements located within a substrate, a method for providing both a metallization system, said underlying metallization system having a gold top surface layer and lying over a surface to which passivation materials adhere, and interconnection between a portion of the overlying metallization system and said underlying metallization system such that elements in said substrate can be contacted by metallization lying in different planes with device hermeticity and ohmic contact qualities maintained, comprising the steps of:

covering said underlying metallization system and the material over which it lies with a passivation layer;

forming a layer of titanium followed by a layer of platinum over a selected portion of said passivation layer;

removing vertically adjacent portions of said titanium and platinum layers from the vicinity of the location at which electrical connection is to be made between said overlying and underlying metallization systems;

forming a hole through said passivation layer at said connection location after having removed the adjacent portions of said titanium and platinum layers;

evaporating a layer of gold over the top surface of the structure thus formed, said evaporated layer extending into said hole and contacting the gold top layer of said underlying metallization system; and plating a further layer of gold on top of said evaporated layer of gold, said evaporated layer serving as a current carrier in said plating step, whereby contact is made between said metallizations and whereby an overlying beam lead type structure is formed as said second metallization system.

2. The method as recited in claim 1 wherein said gold evaporating step includes the evaporation of gold over the entire exposed top surface of the structure formed by the titanium and platinum layers, said passivation layer and said gold top surface layer, and further including the steps of:

after evaporation and prior to gold plating, masking those portions of said evaporated layers which are to be removed from the surface of said passivation layer, said mask preventing the plating of gold on the masked surfaces of said evaporated layer;

removing said mask after said plating step; and etching the top surface of the structure formed after said plating step until that portion of the evaporated gold which was masked is removed from said passivation layer, whereby a gold contact is patterned and the top surface of said gold contact is cleaned during said etching step.

3. The method as recited in claim 2 wherein said platinum and titanium layers are removed from the vicinity of the hole in said passivation layer prior to said evaporation step such that said evaporated gold layer is presented with a double shallow stepped structure whereby said evaporated layer evenly covers the corners of said shallow steps.

4. A second metallization system on top of a first metallization system, said first metallization system having a gold top surface, said second metallization system contacting said first metal-lization system through a hole in a passivation layer therebetween, comprising:

a layer of titanium on top of said passivation layer and a layer of platinum on top of said titanium layer, both of said layers being removed from the vicinity of said hole;

an evaporated layer of gold on top of said platinum layer, on top of all portions of said passivation layer not covered by said titanium and platinum layers and on the gold top surface of said first metallization system; and a layer of plated gold over top of said evaporated layer, said evaporated layer having served as a current carrier in the plating process, whereby said metal layers comprise said second metallization system.

5. In a multilayered metallization system for contacting elements formed in a semiconductor substrate, a second metallization system on top of a first metallization system, said first metallization system having a gold top surface, said second metallization system separated from said first metallization system by a passivation layer having a hole therethrough, said second metallization system contacting said first metallization system through said hole in the passivation layer therebetween, said second metallization system comprising:

a layer of titanium on top of said passivation layer and a layer of platinum on top of said titanium layer, both of said layers being removed from the vicinity of said hole; and a layer of gold on top of said platinum layer, on top of that portion of said passivation layer exposed by the removal of said platinum and titanium layers and on the gold top surface of said first metallization system, whereby said gold layer is presented with a shallow two-step structure such that the corners of said steps are evenly covered with gold, whereby a gold-gold interface exists between said two metallization systems.

6. The apparatus as recited in claim 5 wherein said first metallization system is a beam lead type metallization system including layers of titanium, platinum and gold, whereby both metallization systems are beam lead structures.

7. The apparatus as recited in claim 5 wherein said titanium layer is 1100 A in thickness and wherein said platinum layer is 1500 A in thickness.

8. The apparatus as recited in claim 5 wherein said gold layer is formed by first evaporating a layer of gold and then plating a layer of gold on top of said evaporated layer.

9. The apparatus as recited in claim 8 wherein said evaporated layer is approximately 5,000 A thick.

* * * * *